United States Patent
Krishnakalin et al.

(10) Patent No.: US 7,673,204 B2
(45) Date of Patent: Mar. 2, 2010

(54) METHOD USING NON-LINEAR COMPRESSION TO GENERATE A SET OF TEST VECTORS FOR USE IN SCAN TESTING AN INTEGRATED CIRCUIT

(75) Inventors: Gahn W. Krishnakalin, Austin, TX (US); Emiliano Lozano, Austin, TX (US); Bao G. Truong, Austin, TX (US); Samuel I. Ward, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 11/773,578

(22) Filed: Jul. 5, 2007

(65) Prior Publication Data

US 2009/0013227 A1 Jan. 8, 2009

(51) Int. Cl.
*G01R 31/28* (2006.01)

(52) U.S. Cl. .................................................. 714/728

(58) Field of Classification Search ............... 714/738, 714/728
See application file for complete search history.

(56) References Cited

U.S. PATENT DOCUMENTS

| | | | |
|---|---|---|---|
| 5,991,909 A * | 11/1999 | Rajski et al. ............ | 714/729 |
| 7,178,078 B2 * | 2/2007 | Hiraide et al. ........... | 714/739 |
| 7,197,721 B2 * | 3/2007 | Patil et al. ............... | 716/1 |
| 7,296,249 B2 * | 11/2007 | Rinderknecht et al. ... | 716/4 |
| 7,302,626 B2 * | 11/2007 | Balakrishnan et al. ... | 714/738 |
| 7,509,546 B2 * | 3/2009 | Rajski et al. ............ | 714/718 |
| 7,516,376 B2 * | 4/2009 | Okano et al. ............ | 714/726 |
| 2006/0020862 A1 * | 1/2006 | Kang et al. .............. | 714/726 |
| 2008/0133990 A1 * | 6/2008 | Lin et al. ................ | 714/726 |

OTHER PUBLICATIONS

U.S. Appl. No. 11/738,695, filed Apr. 23, 2007, Ward.
U.S. Appl. No. 11/738,746, filed Apr. 23, 2007, Ward.
Ward et al., "Using Statistical Transformations to Improve Compression for Linear Decompressors", Proceedings of the 2005 20th IEEE International Symposium on Defect and Fault Tolerance in VLSI Systems (DFT'05), U.S., pp. 1-9.

* cited by examiner

*Primary Examiner*—James C Kerveros
(74) *Attorney, Agent, or Firm*—Diana R. Gerhardt; Duke W. Yee

(57) ABSTRACT

A method is provided that uses non-linear data compression in order to generate a set of test vectors for use in scan testing an integrated circuit. The method includes the steps of initially designing the set of test vectors, and selecting one of multiple available coding schemes for each test vector wherein at least two of the coding schemes selected for encoding are different from one another, and wherein one of the available coding schemes represents non-encoded data. The method further comprises operating a random pattern generator to generate data blocks, each corresponding to one of the test vectors, wherein the data block corresponding to a given test vector is encoded with a bit pattern representing the coding scheme of the given test vector. The corresponding data block also has a bit length that is less than the bit length of the given test vector. Each data block is routed to a plurality of decoders, wherein each decoder is adapted to recognize only one of the coding schemes represented by one of the bit patterns. The decoder recognizing the coding scheme of the data block decodes the bit pattern of the data block and generates the test vectors corresponding to the data block.

19 Claims, 2 Drawing Sheets

METHOD USING NON-LINEAR COMPRESSION TO GENERATE A SET OF TEST VECTORS FOR USE IN SCAN TESTING AN INTEGRATED CIRCUIT

BACKGROUND OF THE INVENTION

1. Field of the Invention

The invention disclosed and claimed herein generally pertains to a method for providing a set of test patterns or test vectors for use in scan testing an integrated circuit or other microelectronic component. More particularly, the invention pertains to a method of the above type wherein non-linear compression is used, in connection with a random pattern generator that is operated to provide the test patterns. Even more particularly, the invention pertains to a method of the above type that uses multiple non-linear encoding schemes for data compression, and thereby allows the random pattern generator to be of reduced size.

2. Description of the Related Art

As is known by those of skill in the art, Design for Testability (DFT) refers to certain design techniques, wherein features are added to an integrated circuit (IC) or other microelectronic hardware for use in testing data. In a DFT technique known as scan testing, a scan enable signal is added to the design of an IC chip. When this signal is asserted, respective flip-flops or latches in the IC are connected together to form one or more shift registers, wherein each register has an input pin and an output pin. Using the clock signal of the IC, pre-selected patterns of test vectors can be entered into the chain of flip-flops, and the state of every flip-flop is then read out. Thus, a substantial set of test output data is generated, such as a data set comprising 1,000 or 2,500 bits. This output data is thereby made available for analysis, in order to detect the presence of faults in the IC. As is well known, the input test patterns are typically designed or customized to a particular IC chip. A pseudorandom generator is a common device used for producing the required test patterns.

As is further well known, while an input test pattern may comprise logic 1's or 0's at 1,000 bit positions, only the logic values at a comparatively small number of bit positions, such as 50 or 100 positions, will typically be important for a particular scan test procedure. These important bits or bit positions are referred to herein as specified bits. The logic values at all of the other positions do not matter. Accordingly, the term "don't care bit" is used herein to mean a data bit or data bit position that can have either a logic 1 or a logic 0 value, so that the value of the bit position is not important.

Given the very large number of don't care bits that can be found in the test vectors of a test data set, a significant number of test vector compression schemes have been developed, wherein a linear decompressor using only linear operations is employed to decompress the test vectors. These schemes include techniques based on linear feedback shift register (LFSR) reseeding, and combinational linear expansion circuits consisting of XOR Gates. Linear compression schemes are very efficient at exploiting don't care values in the test cubes, in order to achieve large amounts of compression. At present, virtually all available commercial tools for compressing test vectors use linear compression schemes. Test data compression reduces test costs by reducing tester storage, test time, and test data bandwidth requirements.

However, notwithstanding the benefits of currently available linear compressors, the amount of compression that can be achieved with linear compression schemes depends directly on the number of specified bits in the test vector. While linear decompressors are very efficient at exploiting don't care bits in the test data, they cannot exploit collations in the test data, and thus cannot compress the test data to less than the total number of specified bits in the test data. Accordingly, effort has been made to achieve further compression by supplementing linear schemes with non-linear compression.

In one technique, based on probability of usage, a non-linear decoder uses non-linear statistical transformations that exploit correlations in the test data, in order to reduce the number of specified bits that need to be produced by the linear decompressor. This technique is disclosed in a paper authored by Ward et al, and entitled "*Using Statistical Transformations to Improve Compression for Linear Decompressors*", $20^{th}$ IEEE International Symposium on Defect and Fault Tolerance (VLSI Systems), pages 42-50, 2005 (hereinafter "Ward publication") This paper was co-authored by one of the inventors named herein. However, such technique is limited to a single set of correlated data. Also, while meritorious, the technique requires an iterative procedure that could involve substantial complexity. It would be desirable to provide a method of non-linear compression that was significantly simpler, and yet achieved the goal of reducing the number of specified bits that must be produced by the compressor.

SUMMARY OF THE INVENTION

A method is provided that uses non-linear data compression in order to generate a set of test vectors for use in scan testing an integrated circuit. The method includes the steps of initially designing the set of test vectors, and selecting one of multiple available coding schemes for each test vector. The method further comprises operating a random pattern generator to generate data blocks, each corresponding to one of the test vectors, wherein the data block corresponding to a given test vector is encoded with a bit pattern representing the coding scheme of the given test vector. The corresponding data block also has a bit length that is less than the bit length of the given test vector. Each data block is routed to at least one of a plurality of decoders, wherein each decoder is adapted to recognize the coding scheme represented by one of the bit patterns. A decoder is operated to generate one of the test vectors, when the decoder receives the block corresponding to the generated test vector, and recognizes the coding scheme that is encoded by the received data block.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
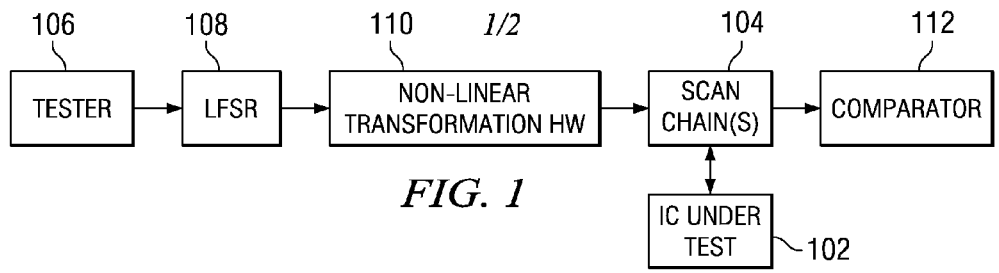
FIG. 1 is a block diagram showing a scan testing configuration in which an embodiment of the invention is implemented.

Referring to FIG. 1, there is shown an integrated circuit 102 disposed for scan testing, in order to detect faults therein. During a scan test operation, latches or flip-flops of IC 102 are connected serially into a scan chain or scan chains 104. Test patterns or test vectors are generated by the combined action of tester 106, LFSR 108 and non-linear transformation hardware 110, as described hereinafter, and are then introduced into IC 102 through IC input pins (not shown). The test pattern is shifted into a scan chain serially, one bit per clock cycle. After a selected number of captured clock cycles, the resulting state of the test data is shifted out through an output pin (not shown) of the IC. The retained output values can then be compared with expected output values, by means of a comparator 112 or the like. If an IC has n pins, then a test vector for the IC will contain n bits, one bit for each pin. A test pattern usefully consists of a sequence of m subsequent test vectors that are applied to the IC in a particular order.

The LFSR 108 is configured to generate pseudo-random patterns, and is connected to tester 106 to receive seeding values therefrom. The seeding values loaded into LFSR 108 are selected to operate the LFSR to produce test vector patterns intended to improve fault detection of the IC 102. In a conventional approach, given a test configuration for a particular chip, a system of linear equations are created and solved. The design of the LFSR and selection of the seeding values are then carried out to implement the equations. Moreover, as described above, the test vectors generally include a substantial number of don't care bits. Accordingly, LSFR 108 can be configured to apply linear compression to blocks of data outputted thereby, such as by filling don't care bit positions with repetitive values.

In addition, and in accordance with an embodiment of the invention, the data blocks outputted by LSFR 108 are respectively encoded, by applying one-bit or two-bit code words thereto. More particularly, each code word represents one of a plurality of schemes for encoding specified bits for a test vector. For example, if a test vector needed for a scan test contains a string of specified bits that are all logic 0's, the string could be encoded in an output block of LFSR 108 by using a brief code word or bit pattern. If there were four possible coding schemes, a two-bit code word could be used. The test vector would then be subsequently generated from a bit pattern carried by the encoded output block, as described hereinafter in further detail.

Figure 2:
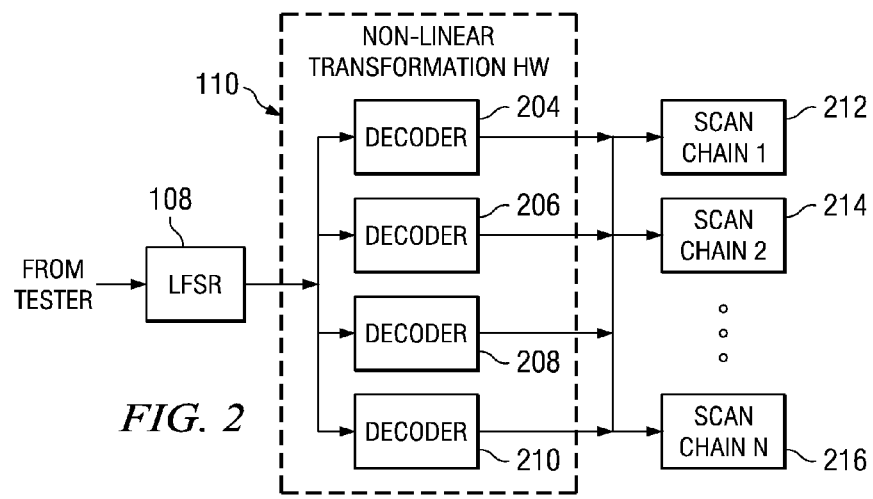
FIG. 2 is a block diagram showing certain components of FIG. 1 in greater detail.

Referring to FIG. 2, there are shown scan chains 212-216, also referenced as scan chains 1-n to indicate n scan chains. In scan testing, the n scan chains are loaded with one n bit block of data at a time, each clock cycle (i.e. one bit-slice of each scan chain is loaded at a time).

FIG. 2 also shows four decoders 204-210, which are coupled to receive respective encoded output blocks from LSFR 108. Each decoder responds to a different type of output block, bit pattern and coding scheme, as described hereinafter. Thus, the four decoders collectively indicate that four different coding schemes are being used in the embodiment. However, the invention is not limited thereto. Other embodiments of the invention may use other numbers and types of coding schemes, together with corresponding decoders. It is to be emphasized that embodiments can select from all types of coding schemes that are available, and can use more than four coding schemes and decoders. In one useful embodiment, decoders 204 and 206 correspond to run length coding and zero coding techniques, respectively. Decoder 208 corresponds to the technique of the Ward publication, referred to above, which is a probability of usage technique. Decoder 210 is responsive to LFSR output blocks that are not encoded, as described hereinafter.

In a design or configuration that did not include transformation hardware 110, the output stream of LFSR 108 would have to provide an n-bit output block during each clock cycle, in order to supply the set of test vectors that need to be applied in the scan chains. However, by providing transformation hardware 110 as shown in FIG. 2, the output streams required from the LFSR 108 can be significantly reduced. This is achieved by representing multiple specified bits of test data by brief code words or bit patterns, as described above. As a result, the output blocks of LFSR 108 can be k-bit blocks rather than n-bit blocks, where k is substantially less than n. By significantly reducing the size of the required outputs from LFSR 108, the LFSR can itself can also be made much smaller, thereby reducing cost and complexity thereof. The seeding values needed to generate successive patterns can also be diminished.

Respective output blocks of LFSR 108 can be encoded by applying an encoding algorithm in the design of the LFSR, and by recognizing certain patterns contained in test vectors that must be delivered to the scan chains. Thus, if a given test vector has a pattern that includes at least one specified bit that is a logic 1, and there are no don't care bits in the pattern, run length coding is used for the given test vector. Run length coding is a form of data compression wherein a run or sequence of the same data value is coded as a single data value and count. Accordingly, when LFSR outputs a k-bit block corresponding to the given test vector, the output block is encoded to indicate the run length coding scheme. While the output block is routed to each of the decoders 204-210, only run length decoder 204 responds to the code word thereof. As its response to the encoded output block, decoder 204 generates an n-bit test vector corresponding to the output block, and routes the test vector to the scan chains.

In similar manner, if the bits in a test vector are all specified bits and are all logic 0's, a zero coding scheme is used for that test vector. The k-bit output block corresponding to the test vector is encoded with a zero coding bit pattern, and decoder 206 responds thereto by generating the n-bit test vector.

If a test vector does not meet the conditions for the coding scheme of either decoder 204 or 206, the coding technique set forth in the Ward publication, referenced above, could be used therewith. Decoder 208 would be configured to detect a code word representing this technique, and to generate the corresponding test vector in response thereto. Alternatively, an original set of test data could be left unencoded, and a corresponding test vector comprising the original set of data would be generated by decoder 210.

Figure 3:
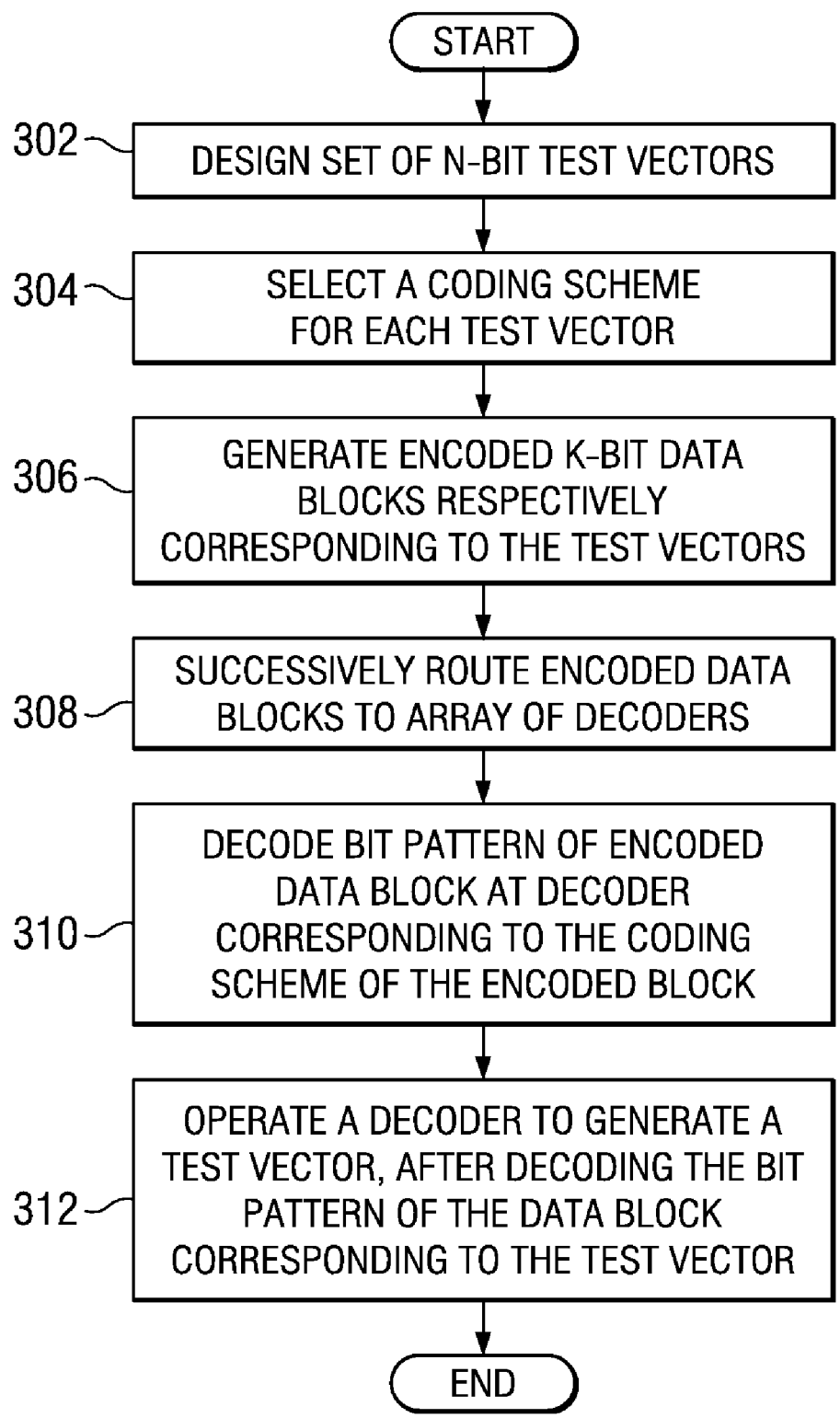
FIG. 3 is a flow chart showing principal steps for an embodiment of the invention.

Referring to FIG. 3, there are shown steps for carrying out a procedure in accordance with an embodiment of the invention. At step 302, a set of n-bit test vectors are conventionally designed, to carry out a scan test of a specified IC. At step 304, patterns of specified logic 1's and 0's and don't care bits are analyzed for respective test vectors. Coding schemes are then selected, in order to encode at least some of the specified bit patterns. While four coding schemes were described above, other embodiments can use different combinations of coding schemes.

At step 306, k-bit output data blocks are generated by means of the pseudorandom generator, wherein each data block corresponds to one of the test vectors. Each data block is also encoded with a bit pattern to represent the coding scheme used for its corresponding test vector. The data block may be coded with additional information, such as the number of bits in an encoded run. At step 308, the encoded data blocks are successively routed to the decoders, wherein each decoder is disposed to detect a different one of the coding schemes.

Referring further to FIG. 3, upon receiving an encoded data block at the decoder that corresponds to the coding scheme of the data block, the decoder acts to decode the bit pattern of the block, as shown by step 310. The decoder is then operated to generate the test vector corresponding to the encoded data block, in accordance with step 312.

Figure 4:
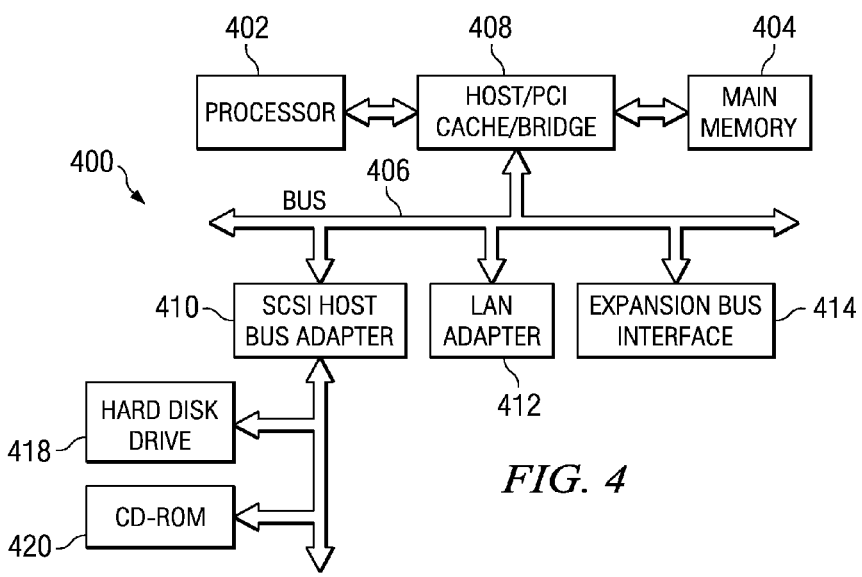
FIG. 4 is a block diagram showing a data processing system that can be used in implementing an embodiment of the invention.

Referring to FIG. 4, there is shown a block diagram of a generalized data processing system 400 which may be used to carry out an embodiment of the invention. Data processing system 400 exemplifies a computer, in which code or instructions for implementing the processes of the present invention may be located. Data processing system 400 usefully employs a peripheral component interconnect (PCI) local bus architecture, although other bus architectures may alternatively be used. FIG. 4 shows a processor 402 and main memory 404 connected to a PCI local bus 406 through a Host/PCI bridge 408. PCI bridge 408 also may include an integrated memory controller and cache memory for processor 402.

Referring further to FIG. 4, there is shown a local area network (LAN) adapter 412, a small computer system interface (SCSI) host bus adapter 410, and an expansion bus interface 414 respectively connected to PCI local bus 406 by direct component connection. SCSI host bus adapter 410 provides a connection for hard disk drive 518, and also for CD-ROM drive 420.

An operating system runs on processor 402 and is used to coordinate and provide control of various components within data processing system 400 shown in FIG. 4. The operating system may be a commercially available operating system such as Windows XP, which is available from Microsoft Corporation. Instructions for the operating system and for applications or programs are located on storage devices, such as hard disk drive 420, and may be loaded into main memory 404 for execution by processor 402.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method using non-linear data compression in generating a set of test vectors for use in scan testing an integrated circuit, wherein said method comprises the steps of:

initially designing, by a tester, said set of test vectors;

selecting one of multiple available coding schemes for each test vector, wherein at least two of the coding schemes selected for encoding are different from one another, and wherein one of the available coding schemes represents non-encoded data;

generating, by a random pattern generator, data blocks, each corresponding to one of said test vectors, wherein the data block corresponding to a given test vector is encoded with a bit pattern to represent the coding scheme of said given test vector, and at least one of said corresponding data blocks has a bit length that is less then the bit length of said given test vector;

routing each of said data blocks to a plurality of decoders, wherein each decoder is adapted to recognize only one of said coding schemes by detecting the bit pattern representing a given coding scheme; and decoding, by the decoder recognizing the coding scheme of the data block, the bit pattern of the data block and generating said test vector corresponding to the data block, for use in scan testing the integrated circuit.

2. The method of claim 1, wherein:

the coding scheme for a particular test vector is selected to represent a pattern of logic 1 bits, logic 0 bits, and don't care bits that are included in the particular test vector.

3. The method of claim 1, wherein:

one of said selected coding schemes comprises run length coding.

4. The method of claim 1, wherein:

one of said selected coding schemes comprises zero coding.

5. The method of claim 1, wherein:

and one of said selected coding schemes comprises a probability of usage technique.

6. The method of claim 1, wherein:

said random pattern generator comprises a linear feed back shift register disposed to receive successive seeding values, in order to generate said data blocks.

7. The method of claim 1, wherein:
    each data block has a bit length of k-bits, and each test vector has a bit length of n-bits, wherein k is significantly less than n.

8. A computer program product embedded in a computer readable medium stored in a computer that executes instructions of the computer program product, for using non-linear data compression in generating a set of test vectors for use in scan testing an integrated circuit, wherein said computer program product comprising the steps of:
    first instructions for initially designing said set of test vectors, and selecting one of multiple available coding schemes for each test vector, wherein at least two of the coding schemes selected for encoding are different from one another, and wherein one of the available coding schemes represents non-encoded data;
    second instructions for generating, by a random pattern generator, a data blocks, each corresponding to one of said test vectors, wherein the data block corresponding to a given test vector is encoded with a bit pattern to represent the coding scheme of said given test vector, and at least one of said corresponding data block has a bit length that is less then the bit length of said given test vector;
    third instructions for routing each of said data blocks to at least one of a plurality of decoders, wherein each decoder is adapted to recognize only one of said coding schemes by detecting the bit pattern representing a given coding scheme; and
    fourth instructions for a decoding, by the decoder recognizing the coding scheme of the data block, the bit pattern of the data block and generating said test vectors, corresponding to the data block, for use in scan testing the integrated circuit.

9. The computer program product of claim 8, wherein:
    the coding scheme for a particular test vector is selected to represent a pattern of logic 1 bits, logic 0 bits, and don't care bits that are included in the particular test vector.

10. The computer program product of claim 8, wherein:
    one of said selected coding schemes comprises run length coding, and another one of said coding schemes comprises zero coding.

11. The computer program product of claim 8, wherein:
    one of said selected coding schemes comprises zero coding.

12. The computer program product of claim 8, wherein:
    said random pattern generator comprises a linear feed back shift register disposed to receive successive seeding values, in order to generate said data blocks.

13. The computer program product of claim 8, wherein:
    each data block has a bit length of k-bits, and each test vector has a bit length of n-bits, wherein k is significantly less than n.

14. An apparatus using non-linear data compression in generating a set of test vectors for use in scan testing an integrated circuit, wherein said apparatus comprises:
    a component for initially designing said set of test vectors, and selecting one of multiple available coding schemes for each test vector, wherein at least two of the coding schemes selected for encoding are different from one another, and wherein one of the available coding schemes represents non-encoded data;
    a random pattern generator for generating data blocks, each corresponding to one of said test vectors, wherein the data block corresponding to a given test vector is encoded with a bit pattern to represent the coding scheme of said given test vector, and at least one of said corresponding data block has a bit length that is less then the bit length of said given test vector;
    a component for routing each of said data blocks to a plurality of decoders, wherein each decoder is adapted to recognize only one of said coding schemes by detecting the bit pattern representing a given coding scheme; and
    the decoder recognizing the coding scheme of the data block, for decoding the bit pattern of the data block and generating said test vector corresponding to the data block, for use in scan testing the integrated circuit.

15. The apparatus of claim 14, wherein:
    the coding scheme for a particular test vector is selected to represent a pattern of logic 1 bits, logic 0 bits, and don't care bits that are included in the particular test vector.

16. The apparatus of claim 14, wherein:
    one of said selected coding schemes comprises run length coding, and another one of said coding schemes comprises zero coding.

17. The apparatus of claim 14, wherein:
    one of said selected coding schemes comprises a probability of usage technique.

18. The apparatus of claim 14, wherein:
    said random pattern generator comprises a linear feed back shift register disposed to receive successive seeding values, in order to generate said data blocks.

19. The apparatus of claim 14, wherein:
    each data block has a bit length of k-bits, and each test vector has a bit length of n-bits, wherein k is significantly less than n.

* * * * *